United States Patent
Wang et al.

(10) Patent No.: US 11,169,443 B2
(45) Date of Patent: Nov. 9, 2021

(54) GAP FILLING COMPOSITION AND PATTERN FORMING METHOD USING LOW MOLECULAR WEIGHT COMPOUND

(71) Applicant: AZ Electronic Materials (Luxembourg) S.a.r.l., Luxembourg (LU)

(72) Inventors: Xiaowei Wang, Iwata (JP); Tatsuro Nagahara, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 2 days.

(21) Appl. No.: 16/090,992

(22) PCT Filed: Apr. 3, 2017

(86) PCT No.: PCT/EP2017/057799
§ 371 (c)(1),
(2) Date: Oct. 3, 2018

(87) PCT Pub. No.: WO2017/174476
PCT Pub. Date: Oct. 12, 2017

(65) Prior Publication Data
US 2019/0113848 A1 Apr. 18, 2019

(30) Foreign Application Priority Data
Apr. 5, 2016 (JP) .............................. JP2016-076087

(51) Int. Cl.
*G03F 7/40* (2006.01)
*G03F 7/32* (2006.01)
*G03F 7/38* (2006.01)

(52) U.S. Cl.
CPC .................. *G03F 7/40* (2013.01); *G03F 7/32* (2013.01); *G03F 7/325* (2013.01); *G03F 7/38* (2013.01)

(58) Field of Classification Search
CPC .................. G03F 7/40; G03F 7/38; G03F 7/32
See application file for complete search history.

(56) References Cited

U.S. PATENT DOCUMENTS

| 8,795,952 B2 | 8/2014 | Somervell et al. |
| 2012/0211025 A1 | 8/2012 | Kumon et al. |
| 2014/0057437 A1 | 2/2014 | Kozawa et al. |
| 2015/0221500 A1 | 8/2015 | Ogihara et al. |
| 2016/0005641 A1* | 1/2016 | Sim .................. H01L 21/76224 438/438 |
| 2016/0109805 A1 | 4/2016 | Matsuura et al. |

FOREIGN PATENT DOCUMENTS

| EP | 1178359 A2 | 2/2002 |
| JP | 201444298 A | 3/2014 |
| KR | 20030050173 A | 6/2003 |
| WO | WO-2014181748 A1 | 11/2014 |

OTHER PUBLICATIONS

International Search Report for PCT/EP2017/057799 dated Jul. 10, 2017.
Jincao, Y., et al., "Prevention of Photoresist Pattern Collapse by Using Liquid Carbon Dioxide", Industrial & Engineering Chemistry Research, vol. 40, No. 24, (2001), pp. 5858-5860.
Ohiwa, T., "Reactive Ion Etching", Toshiba Review, vol. 59, No. 8, (2004), pp. 22-25.
Written Opinion of the International Searching Authority for PCT/EP2017/057799 dated Jul. 10, 2017.

* cited by examiner

*Primary Examiner* — Daborah Chacko-Davis
(74) *Attorney, Agent, or Firm* — Faegre Drinker Biddle & Reath LLP

(57) ABSTRACT

There is provided a gap filling composition which can reduce pattern collapse and a pattern forming method using the composition. There is provided a gap filling composition including a gap filling compound, an organic solvent, and as required, water, the gap filling compound having a certain structure and containing hydroxyl groups, carboxyl groups, or amino groups intramolecularly. There is provided a pattern forming method using a low molecular weight compound.

19 Claims, 2 Drawing Sheets

(a)

(d)

(b)

(e)

(c)

(f)

(a)

(b)

GAP FILLING COMPOSITION AND PATTERN FORMING METHOD USING LOW MOLECULAR WEIGHT COMPOUND

CROSS-REFERENCE TO RELATED APPLICATIONS

This application is a national stage application (under 35 U.S.C. § 371) of PCT/EP2017/057799, filed Apr. 3, 2017, which claims benefit of Japanese Application No. 2016-076087, filed Apr. 5, 2016, both of which are incorporated herein by reference in their entirety.

BACKGROUND OF THE INVENTION

Field of the Invention

The present invention relates to a gap filling composition and a pattern forming method using the composition. Specifically, the present invention relates to a gap filling composition used, in a semiconductor manufacturing process, for forming a pattern having a high aspect ratio, and to a pattern forming method enabling reduction of pattern collapse by using a low molecular weight compound.

Background Art

In recent years, increasing demand for highly integrated LSIs requires miniaturization of patterns. In order to address such demand, lithography processes having a short wavelength are being put to practical use, such as KrF excimer laser (248 nm), ArF excimer laser (193 nm), extreme ultraviolet ray (EUV, 13 nm), X-ray, and electron beam. In order to address such miniaturization of resist pattern, photosensitive resin compositions used as a resist in microfabrication are also required to be highly resolved. However, advanced miniaturization as described above tends to cause resist pattern collapse. For such problems, improvement of resists, for example, by alteration of their composition is under research.

In addition, the resist pattern collapse is thought to occur owing to negative pressure generated between patterns caused by surface tension of pure water with which the patterns are rinsed after development. From this viewpoint, in order to reduce resist pattern collapse, a rinsing solution containing a certain component is proposed to be used for rinse in place of conventionally used pure water (for example, Patent literature 1). These patent literatures propose to use, for rinse, a rinse liquid for lithography containing a certain nonionic surfactant.

Further, a method is proposed which fills a gap filling agent between resist patterns, and then dries and removes the gap filling agent, to reduce pattern collapse (For example, Patent literature 2).

PRIOR ART REFERENCES

Patent Literature

[Patent literature 1] JP-A-2014-44298
[Patent literature 2] U.S. Pat. No. 8,795,952

Non-Patent Literature

[Non-patent literature 1] Toshiba Review Vol. 59 No. 8 (2004), pp 22-25

SUMMARY OF THE INVENTION

Problems to be Solved by the Invention

Although Patent literature 1 attempts to reduce resist pattern collapse by relaxing surface tension, it is insufficient for preventing patterns having a high aspect ratio from pattern collapse. The present inventors have found that the method described in Patent literature 2 generally requires high temperature processing in order to vaporize a polymer contained in a gap filling agent, and is likely to impact resist patterns. Further, the problem of pattern collapse described in Patent literatures 1 and 2 may occur for not only resist patterns but also patterns formed from a material other than the resist by using the resist patterns as a mask.

The present invention has been achieved in view of the above-described background and provides not only a gap filling composition which is less likely to impact pattern shapes even when applied to a pattern having a high aspect ratio and can reduce pattern collapse, but also a pattern forming method using the composition. Further, the present invention provides a device which includes a pattern formed by the pattern forming method and has excellent properties.

Means for Solving the Problems

The gap filling composition according to the present invention includes:

a gap filling compound represented by the following general formula (Ia),

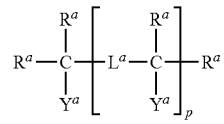

formula (Ia)

(wherein each $R^a$ independently represents hydrogen, alkyl having 1 to 5 carbon atoms, or aryl having 6 to 12 carbon atoms, each $L^a$ independently represents alkylene having 1 to 10 carbon atoms, haloalkylene having 1 to 10 carbon atoms, heteroalkylene having 1 to 10 carbon atoms having oxy, imino, sulfide on a terminal or between carbons thereof, oxy, imino, sulfide, or a single bond, each $Y^a$ independently represents —OH, —COOH, or —$NR^1{}_2$, each $R^1$ independently represents hydrogen or alkyl having 1 to 5 carbon atoms, and p represents an integer of 1 to 8), or the following general formula (Ib),

  formula (Ib)

(wherein each $R^b$ independently represents alkyl having 1 to 5 carbon atoms, or aryl having 6 to 12 carbon atoms, $Z^b$ represents cycloalkyl having 3 to 13 ring member atoms, heterocycloalkyl of 3 to 13 ring member atoms including O, N, or S, or aryl having 6 to 20 carbon atoms, each $Y^b$ independently represents —OH, —COOH, or —$NR^2{}_2$, each $R^2$ independently represents hydrogen or alkyl having 1 to 5 carbon atoms, and q represents an integer of 2 to 5, and r represents [a maximum number of substituents of the cycloalkyl or the heterocycloalkyl]-q);

an organic solvent; and water, wherein the mass ratios of the gap filling compound, the organic solvent, and water to the total mass of the gap filling composition are not less than 1% and not more than 100%, not less than 5% and not more than 99%, and not less than 0% and not more than 30%, respectively.

Further, the pattern forming method according to the present invention includes
(i) the step of etching a substrate to form a gap,
(ii) the step of filling a composition including a low molecular weight compound having 2 to 25 carbon atoms into the substrate surface having a gap formed thereon, and
(iii) the step of removing the composition.

Effect of the Invention

By using the composition according to the present invention, pattern collapse of formed patterns can be reduced. In addition, the composition according to the present invention has excellent coatability. For patterns formed by using the method according to the present invention, few residues remain on the substrate after removal of the composition of the present invention.

DETAILED DESCRIPTION OF THE INVENTION

Figure 1:
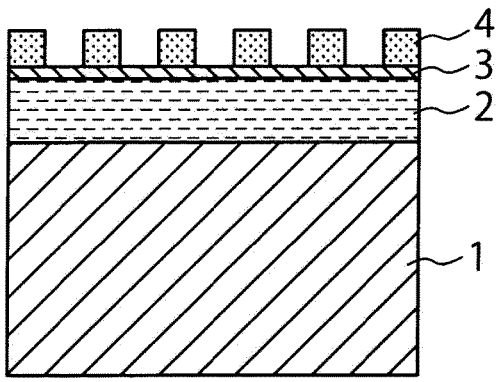
FIG. 1 is an explanatory drawing of a pattern forming method according to the present invention.
Figure 1:
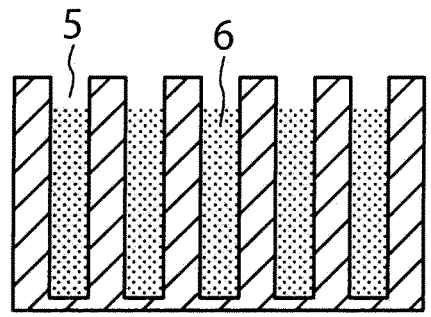
Figure 1:
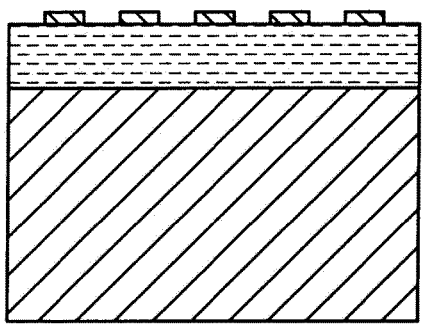
Figure 1:
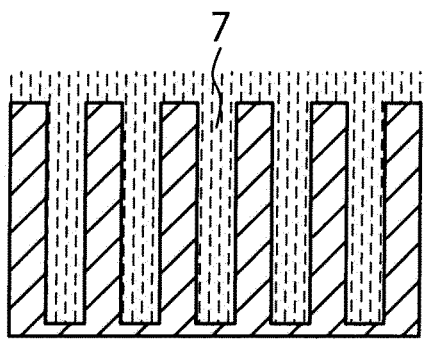
Figure 1:
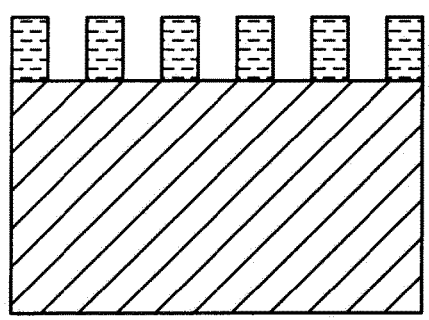
Figure 1:
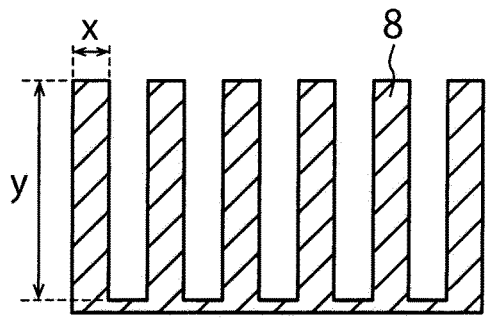

A detailed description of an embodiment of the present invention is as follows.
Gap Filling Composition The gap filling composition according to the present invention includes a certain gap filling compound. Further, it includes, as required, other components. Each of these components is described below.
(I) Gap Filling Compound The gap filling composition used in the present invention includes a low molecular weight compound having 2 to 25 carbon atoms. This low molecular weight compound is preferably a gap filling compound represented by the following general formula (Ia), $$\text{R}^a-\underset{\underset{Y^a}{|}}{\overset{\overset{R^a}{|}}{C}}-\left[\text{L}^a-\underset{\underset{Y^a}{|}}{\overset{\overset{R^a}{|}}{C}}-\text{R}^a\right]_p \qquad \text{formula (Ia)}$$

wherein each $R^a$ independently represents hydrogen, alkyl having 1 to 5 carbon atoms, or aryl having 6 to 12 carbon atoms, each $L^a$ independently represents alkylene having 1 to 10 carbon atoms, haloalkylene having 1 to 10 carbon atoms, heteroalkylene having 1 to 10 carbon atoms having oxy, imino, sulfide on a terminal or between carbons thereof, oxy, imino, sulfide, or a single bond, each $Y^a$ independently represents —OH, —COOH, or —NR$^1{}_2$, each $R^1$ independently represents hydrogen or alkyl having 1 to 5 carbon atoms, and p represents an integer of 1 to 8, or the following formula (Ib), $$[Y^b]_q Z^b [R^b]_r \qquad \text{formula (Ib)}$$

wherein each $R^b$ independently represents alkyl having 1 to 5 carbon atoms or aryl having 6 to 12 carbon atoms, $Z^b$ represents cycloalkyl of 3 to 13 ring member atoms, heterocycloalkyl of 3 to 13 ring member atoms including O, N, or S, or aryl having 6 to 20 carbon atoms, each $Y^b$ independently represents —OH, —COOH, or —NR$^2{}_2$, each $R^2$ independently represents hydrogen or alkyl having 1 to 5 carbon atoms, and q represents an integer of 2 to 5, and r represents [a maximum number of substituents of the cycloalkyl or the heterocycloalkyl]-q.

In the present invention, oxy means —O—, imino means —NR'— (wherein R' represents hydrogen or alkyl having 1 to 5 carbon atoms), and sulfide means —S—.

In the general formula (Ia), examples of $R^a$ includes hydrogen, methyl, ethyl, n-propyl, isopropyl, n-butyl, isobutyl, phenyl, benzyl, tolyl, and so on. $R^a$ is preferably hydrogen, methyl, or ethyl.

In the general formula (Ia), examples of $L^a$ includes a single bond, methylene, ethylene, propylene, butylene, oxy, imino, sulfide, alkane fluoride, and so on. $L^a$ is preferably methylene, ethylene, propylene, butylene, methylene fluoride, ethylene fluoride, or propylene fluoride. The above-mentioned fluoride means that all of hydrogens other than bonding hands are substituted by fluorines. $L^a$ is more preferably methylene, ethylene, or propylene.

In the general formula (Ia), examples of $Y^a$ include —OH, —COOH, —NH$_2$, methylamino, dimethylamino, and so on. At least two among $Y^a$s are preferably —OHs. More preferably, p=1 or 2 is satisfied and all of $Y^a$s are —OHs.

Specifically, representative examples of the compound represented by the general formula (Ia) include 1,2-ethanediol, 1,2-propanediol, 1,3-propanediol, 1,2-butanediol, 1,3-butanediol, 1,4-butanediol, 3-methyl-1,3-butanediol, 3-phenyl-1,3-butanediol, 1,2-pentanediol, 1,3-pentanediol, 2,4-pentanediol, 1,5-pentanediol, 1,2-hexanediol, 2,5-hexanediol, 2,4-diethyl-1,5-pentanediol, 2,4-dimethyl-2,4-pentanediol, 3-methyl-1,5-pentanediol, diethylene glycol, diethanolamine, and so on. Among them, preferred compounds are 1,2-butanediol, 1,3-butanediol, 1,4-butanediol, 3-methyl-1,3-butanediol, and 3-phenyl-1,3-butanediol.

In the general formula (Ib), examples of $R^b$ include hydrogen, methyl, ethyl, n-propyl, isopropyl, n-butyl, isobutyl, phenyl, benzyl, tolyl, and so on. $R^b$ is preferably hydrogen, methyl, and ethyl.

In the general formula (Ib), examples of $Z^b$ include cyclobutane, cyclopentane, cyclohexane, phenyl, naphthyl, anthracene, phenanthrene, naphthacene, fluorene, fluoranthene, pyrene, and so on. $Z^b$ is preferably cyclopentane, cyclohexane, and phenyl.

In the general formula (Ib), examples of $Y^b$ include —OH, —COOH, —NH$_2$, methylamino, dimethylamino, and so on. At least two among $Y^b$s are preferably —OHs. More preferably, q=1 or 2 is satisfied and all of $Y^b$s are —OHs.

Specifically, representative examples of the compound represented by the general formula (Ib) include 1,3-cyclopentanediol, 1,2-cyclohexanediol, 1,3-cyclohexanediol, 1,4-cyclohexanediol, 4-methyl-1,2-cyclohexanediol, 4-methyl catechol, and so on.

In the present invention, the gap filling compound is preferably less volatile than organic solvents and water.

These gap filling compounds can be used, as required, in combination of two or more thereamong.

The gap filling compound of the present invention is preferably difficult to be volatilized by spin dry when applied to substrates and more preferably easy to be volatilized by heating among others. Specifically, the saturated vapor pressure at 150° C. and 1 atm is preferably not less than 100 Pa and not more than 40,000 Pa, and more preferably not less than 1,000 Pa and not more than 30,000 Pa.

The molecular weight of the gap filling compound of the present invention is not particularly limited, but it is preferably not less than 50 and not more than 250, and more preferably not less than 60 and not more than 150, from the view point of its subsequent removal process. With respect to the number of carbons of the gap filling compound of the present invention, a low molecular weight compound having 2 to 25 carbon atoms is preferable, and that having 2 to 10 carbon atoms is more preferable.

The viscosity at 25° C. of the gap filling composition of the present invention is preferably not less than $1 \times 10^{-3}$ Pa·s and not more than $100 \times 10^{-3}$ Pa·s, more preferably not less than $1 \times 10^{-3}$ Pa·s and not more than $70 \times 10^{-3}$ Pa·s, and still more preferably not less than $1 \times 10^{-3}$ Pa·s and not more than $40 \times 10^{-3}$ Pa·s, from the view point of its filling property for patterns having a high aspect ratio, coatability, and filtration property. The viscosity of not more than $1 \times 10^{-3}$ Pa·s causes not only less coatability resulting in difficulty in obtaining a uniformly applied coating but also deterioration of temporal stability of the applied coating. On the other hand, the viscosity of not less than $100 \times 10^{-3}$ Pa·s causes an inferior filling property resulting in non-uniform filling for patterns having a high aspect ratio, a stringing phenomenon upon application, and difficulty in obtaining a uniformly applied coating by using a small dropping amount of the composition owing to its insufficient spreading on the substrate surface. In addition, the transmissivity of the composition through a filter is often poor.

The mass ratio of the gap filling compound is usually not less than 1% and not more than 100%, preferably not less than 2% and not more than 40%, more preferably not less than 2% and not more than 30%, and still preferably not less than 2% and not more than 20% to the total mass of the gap filling composition according to the present invention. When the gap filling compound accounts for a small amount of the gap filling composition, it is thought to be difficult to provide a thick coating when the composition is applied to a wafer.

(II) Organic Solvent

The gap filling composition according to the present invention includes a solvent in order to improve its filling property, coatability, and temporal stability. Any organic solvent can be used so long as it can dissolve the gap filling compound and is more volatile than the gap filling compound. For example, the saturated vapor pressure of the solvent is preferably not less than 100 Pa and not more than 40,000 Pa at 25° C. and 1 atm. Naturally, the organic solvent is preferably different from the gap filling compound. Further, the organic solvent may be a mixture of plural organic solvents.

The gap filling composition according to the present invention is used for the pattern formation described below. In the method, this composition is applied to the substrate rotated, for example, at a rotational speed of not less than 1 rpm and not more than 400 rpm. In this instance, it is preferable that the gap filling compound does not volatilize while the organic solvent volatilizes. From this viewpoint, the difference of the vapor pressure of the gap filling compound from that of the organic solvent is preferably within a certain range in the present invention. For example, the difference of the vapor pressure at 25° C. and 1 atm of the gap filling compound from that of the organic solvent is preferably not less than 100 Pa and not more than 5,000 Pa, and more preferably not less than 200 Pa and not more than 1,000 Pa.

The mass ratio of the organic solvent to the total mass of the gap filling composition according to the present invention is usually not less than 5% and not more than 99%, preferably not less than 20% and not more than 98%, and more preferably not less than 50% and not more than 95%. In the present invention, the coatability of the gap filling composition is thought to worsen when the organic solvent accounts for a small amount of the composition.

Examples of the organic solvent include ethylene glycol monoalkyl ethers, such as ethylene glycol monomethyl ether (PGME), ethylene glycol monoethyl ether, ethylene glycol monopropyl ether, and ethylene glycol monobutyl ether, diethylene glycol dialkyl ethers, such as diethylene glycol dimethyl ether, diethylene glycol diethyl ether, diethylene glycol dipropyl ether, and diethylene glycol dibutyl ether, ethylene glycol alkyl ether acetates, such as methyl cellosolve acetate and ethyl cellosolve acetate, propylene glycol alkyl ether acetates, such as propylene glycol monomethyl ether acetate (PGMEA), propylene glycol monoethyl ether acetate, and propylene glycol monopropyl ether acetate, aromatic hydrocarbons, such as benzene, toluene, and xylene, ketones, such as methyl ethyl ketone, acetone, methyl amyl ketone, methyl isobutyl ketone, cyclohexanone, and 2-heptanone, alcohols, such as ethanol, propanol (for example, isopropyl alcohol (IPA)), butanol (for example, n-butyl alcohol), hexanol, cyclohexanol, ethylene glycol, and glycerin, esters, such as ethyl lactate, methyl acetate, ethyl acetate, butyl acetate, ethyl 3-ethoxypropionate, and methyl 3-methoxypropionate, cyclic esters such as γ-butyrolactone, tetrahydrofuran (THF), and ethers such as dibutyl ether. Among them, preferable is a solvent selected from PGMEA, PGMEA, IPA, n-butyl alcohol, methyl isobutyl ketone, tetrahydrofuran, dibutyl ether, ethyl lactate, methyl acetate, ethyl acetate, butyl acetate, 2-heptanone, γ-butyrolactone, and combinations thereof, from the viewpoint of its availability and ease of handling, and the solubility of the gap filling compound thereto, and so on. PGMEA, PGME, and/or IPA is more preferable.

(III) Water

The gap filling composition according to the present invention includes, as required, not less than 0% and not more than 30% of water. Water to be used is not particularly limited, but it is preferably water, for example pure water, from which organic impurities and metal ions were removed by distillation, an ion exchange treatment, a filtration treatment, and various adsorption treatments. The mass ratio of water is usually not less than 0% and not more than 30%, preferably not less than 0% and not more than 20%, and more preferably not less than 0% and not more than 10% to the total mass of the gap filling composition. Further, the mass ratio of water to the total mass of the gap filling composition is preferably less than that of the organic solvent. In the gap filling composition according to the present invention, water may not be contained.

The mass ratios of the gap filling compound, the organic solvent, and water are preferably not less than 2% and not more than 40%, not less than 20% and not more than 98%, and not less than 0% and not more than 30% to the total mass of the gap filling composition according to the present invention, respectively. They are more preferably not less than 2% and not more than 30%, not less than 20% and not more than 98%, and not less than 0% and not more than 20%, respectively. They are still more preferably not less than 2% and not more than 20%, not less than 50% and not more than 95%, and not less than 0% and not more than 10%, respectively. In the gap filling composition according to the present invention, the sum of the mass ratios of the gap filling compound, the organic solvent and water never exceeds 100%.

The composition to be used in the present invention contains the above-mentioned compounds of (I), (II), and as required (III), and it can be combined, as required, with additional compounds. These materials with which it can be combined are described as follows. The components other than the compounds (I), (II), and (III) is preferably not more than 5%, more preferably not more than 3%, still more preferably not more than 1% by mass to the total mass of the whole composition.

(IV) Surfactant

Further, surfactants can be used, as required, in the gap filling composition of the present invention in order to improve its coatability. Any surfactant can be used. Examples of the surfactant which can be used to the present invention include (A) anionic surfactants, (B) cationic surfactants, (C) non-ionic surfactants, and specifically, preferable are (A) alkyl sulfonate, alkylbenzenesulfonic acid, and alkyl benzene sulfonate, (B) lauryl pyridinium chloride and lauryl methyl ammonium chloride, and (C) polyoxyethylene octyl ether, polyoxyethylene lauryl ether, and polyoxyethylene acetylenic glycol ether. For these surfactants, an example of the non-ionic surfactants, such as non-ionic alkyl ether surfactant from Nippon Nyukazai Co., Ltd. is commercially available.

(V) Other Additives

The gap filling composition according to the present invention can use any other additives so long as they do not impair the effect of the present invention. One example of such additives is plasticizer, such as ethylene glycol, glycerin, and triethyl glycol. In addition, for example, leveling agents can also be used.

The gap filling composition according to the present invention may further include fungicide, an antimicrobial agent, preservative, and/or an antifungal agent. These drugs are used to prevent an aged gap filling composition from growth of bacteria or fungi therein. Examples of these drugs include alcohol such as phenoxyethanol and isothiazolone. BESTCIDE (trade name) commercially available from Nippon Soda Co., Ltd. is a particularly effective preservative, antifungal agent, and fungicide. These drugs typically do not impact the performance of the gap filling composition, and their content is considered to be usually not more than 1%, preferably not more than 0.1%, and more preferably not more than 0.001% by mass, based on the total mass of the gap filling composition.

In addition, the gap filling composition according to the present invention may contain acid or base. The acid or base is used to adjust pH of a processing solution or improve the solubility of each component therein. Any acid or base to be used can be selected so long as it does not impair the effect of the present invention, and examples thereof include, for example, carboxylic acid, amines, and ammonium salt. These include fatty acid, aromatic carboxylic acid, primary amine, secondary amine, tertiary amine, and ammonium compounds, and may be substituted by any substituent. Specifically, they include formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, tetramethylammonium, and so on.

Pattern Forming Method

A fine pattern forming method according to an embodiment of the present invention will now be described with reference to drawings. The pattern forming method according to the present invention applies a certain low molecular weight compound after gap formation in contrast to conventionally known pattern forming methods, but a gap formation method can be optionally selected from conventionally known methods. Such gap formation method is described also in, for example, Non-patent literature 1.

[Pre-Processing]

The gap formation is indispensable to the fine pattern forming method according to the present invention, but various combinations of pre-processing can be antecedent to the gap formation. FIG. 1 (a) shows a substrate 1, on which is formed an applied carbon coating (applied C coating, also referred to as Spin On Carbon coating) layer 2, on which is formed a silicon containing anti-reflective coating (Si-ARC, also referred to as Spin On Glass coating) layer 3, on which are formed resist patterns 4. The substrate to be used is not particularly limited, but it is, for example, a semiconductor substrate (for example, silicon wafer), or a glass substrate such as LCD and PDP. The substrate may include conductive films, wires, and semiconductors formed thereon. The applied carbon coating can be applied by a conventionally known method such as spin coat and then pre-baked, to be shaped into a film. Alternatively, it may be shaped into a film by CVD (Chemical Vapor Deposition) or ALD (Atomic Layer Deposition). The silicon-containing anti-reflective coating layer can be applied by spin coat and then pre-baked, to be shaped into a film. Such a silicon-containing anti-reflective coating layer can improve the cross-sectional shape and exposure margin of resist patterns. Further, since the silicon-containing anti-reflective coating layer is used as an etching mask, it preferably has a property such as etching resistivity.

The resist pattern formation is carried out by applying photoresist on, for example, a silicon-containing anti-reflective coating layer by using a conventionally known method such as spin coat, pre-baking (for example, at a bake temperature of not less than 70° C. and not more than 140° C. for about 1 minute), then exposing the sample with ultraviolet rays such as g-line and i-line, far ultraviolet rays such as KrF excimer laser and ArF excimer laser lights, X-ray, electron beam, and so on, and then as required, performing post exposure bake (PEB) (for example, at bake temperature of not less than 50° C. and not more than 140° C.), followed by development by using a development method such as paddle development, to shape resist patterns. The resist development is carried out usually by using an alkaline developer. An aqueous solution or aqueous liquid, such as sodium hydroxide, tetramethylammonium hydroxide (TMAH) is used as the alkaline developer. After the development processing, the resist patterns are rinsed (cleaned) by using a rinse solution. In this instance, a resist composition to be used is not particularly limited, and either positive or negative resist can be used for the pattern forming method of the present invention. Resist patterns may be formed directly on a substrate or indirectly above a substrate on which is formed any other conventionally known layers such as an anti-reflective coating layer and a hard mask layer, so long as the effect of the present invention is not impaired. Specifically, on the substrate is formed a combination of a silicon-containing anti-reflective coating layer and an applied carbon coating as described above, a single silicon-containing anti-reflective coating layer, or an anti-reflective coating layer, and then resist patterns can be formed thereon. In the formation of applied carbon coating layer, plural applied carbon coatings may also be formed.

FIG. 1 (b) shows silicon-containing anti-reflective coating layer patterns formed through etching the silicon-containing anti-reflective coating layer by using the resist patterns as a mask. This etching may be either dry etching or wet etching. Gas species for dry etching are not especially limited, but Freon-based gas is usually used.

FIG. 1 (c) shows applied carbon coating layer patterns formed through etching the applied carbon coating layer by using the silicon-containing anti-reflective coating layer patterns as a mask. This etching may be either dry etching or wet etching. Gas species for dry etching are not especially limited, but oxygen-based and/or nitrogen-based gas is usually used. For example, a suitable pattern forming method may be shaping resist patterns by using ArF excimer laser light as an exposure source and dry-etching in later processes. Those skilled in the art can select an optimum processing method depending on pattern size.

[Step (i)]

FIG. 1 (d) shows a substrate which was etched by using the applied carbon coating layer patterns as a mask and contains liquid 6 remaining between gaps 5 owing to a processing after the etching. The liquid filled into the gaps may be either a liquid remaining on the substrate surface owing to wet etching or rinse treatment, or a liquid applied to be filled for the purpose of gap filling.

The etching carried out prior to FIG. 1 (d) may be either dry etching or wet etching. Gas species for dry etching are not particularly limited, but Freon-based gas is usually used. Through the etching, gaps are formed on the substrate and the liquid remains therebetween. The reason why the liquid remains between the gaps is that cleaning or rinse treatment by using liquid chemicals is required after dry etching in order to treat residues among others. Even for wet etching, liquid remains between the gaps owing to liquid chemicals used for wet etching or to rinse treatment carried out subsequently as required. This liquid, when spin-dried as is, may cause pattern collapse for patterns having a high aspect ratio owing to an influence of the surface tension of the liquid. Thus, in the method according to the present invention, the above-described liquid is preferably replaced through filling the gap filling composition according to the present invention.

Figure 2:
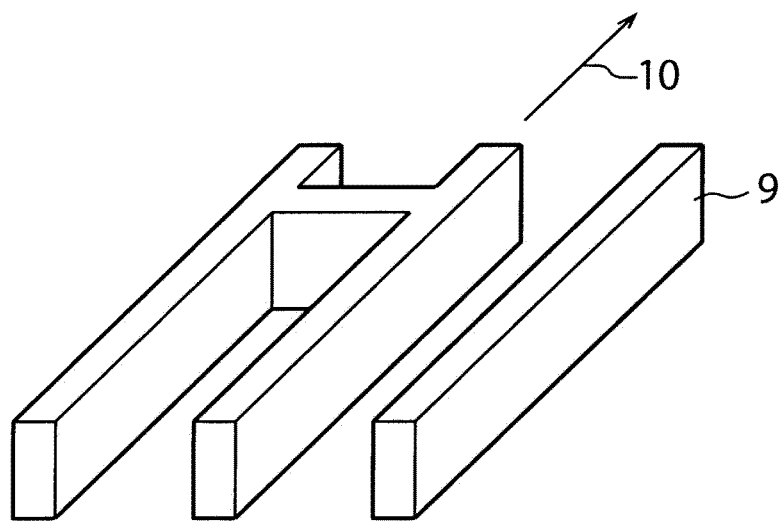
FIG. 2 is an explanatory drawing of topographies between gaps in a conventional pattern forming method.
Figure 2:
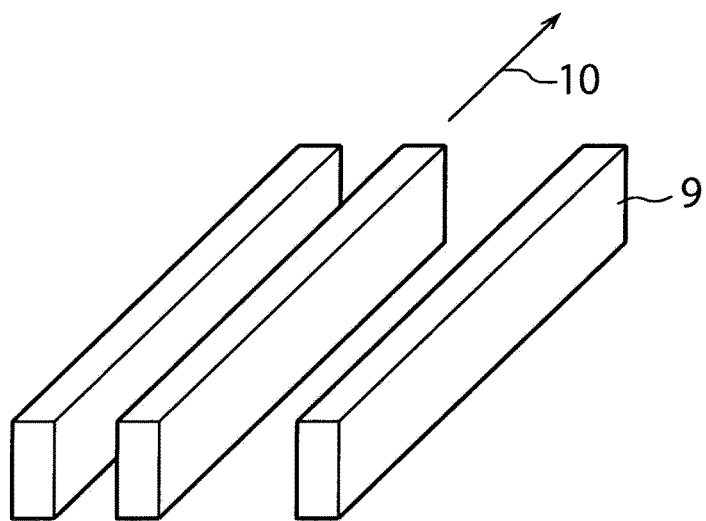

Effects of the present invention are expected as follows, but it does not at all limit the present invention. In the invention described in Patent literature 1, when rinse treatment is carried out, a substrate is rotated to remove, by centrifugal force (spin dry), rinsing solution attached to the substrate surface. In contrast to this, the present inventors have found that, on a substrate having complex trenches (gaps) formed thereon by etching, the width, shape (for example, opening or closing of the far end from the wafer center), or depth of the trenches fluctuates, and may cause non-uniform evaporation of the rinse solution when the rinse solution is removed and dried by centrifugal force. For example, as shown in FIG. 2(a), when the left inter-pattern region is closed in a centrifugal direction 10 from a wafer center and the right inter-pattern region is opened toward the outer direction within the patterns 9, rinse solution remaining in the right region disappears faster during spin dry. Further, as shown in FIG. 2(b), the gap between the left patterns is narrower and that between the right patterns is wider within the patterns 9 as viewed from the wafer center, rinse solution remaining within the right gap disappears faster during spin dry. Even when the surface tension of the liquid is reduced as in the case of Patent literature 1, resist patterns having a high aspect ratio may collapse owing to such effects. In the present invention, a solution of an antecedent process is replaced with the filled gap filling composition, which is then removed through heating among others, and this is expected to enable obtaining patterns free from impurities and preventing the patterns from pattern collapse. Patent literature 2 uses polymer as a gap filling composition for resist patterns, but the described polymer is thought to damage the resist owing to high temperature applied for decomposing and vaporizing the polymer.

[Step (ii)]

FIG. 1 (e) shows a composition 7 including a low molecular weight compound having 2 to 25 carbon atoms, which is filled into gaps. A composition containing a low molecular weight compound having 2 to 25 carbon atoms (for simplicity, hereinafter also referred to as low molecular weight compound) (for simplicity, hereinafter also referred to as composition) is applied while liquid remains as shown in FIG. 1 (d). The low molecular weight compound is preferably a gap filling compound represented by above-described general formula (Ia) or (Ib). The composition containing the low molecular weight compound is typically the gap filling composition according to the present invention. A method of applying the composition is not limited, but it can be carried out by, for example, a method of dropping the composition onto a substrate surface while rotating the substrate at not less than 1 rpm and not more than 400 rpm, a method of dropping the composition onto the substrate at a stationary state and then rotating the substrate at not less than 1 rpm and not more than 400 rpm to spread the composition, a method of dipping the substrate into the composition, or aerosol or spraying of the composition. Among them preferable are the method of dropping a composition onto a substrate surface while rotating the substrate at not less than 1 rpm and not more than 400 rpm, or the method of dropping the composition on the substrate at a stationary state and then rotating the substrate at not less than 1 rpm and not more than 400 rpm to spread the composition. In this instance, at least some of the liquid is replaced with the composition, which is filled into gaps. In order for the effect of the present invention to be exhibited sufficiently, the substitution is preferably carried out sufficiently. In addition, in the pattern forming method according to the present invention, the liquid may be replaced, before filling of the composition, with a solvent into which the low molecular weight compound is soluble. Such a solvent can be suitably selected depending on the kind of the low molecular weight compound. After the above-described step, the substrate may be rotated at not less than 500 rpm and not more than 5000 rpm. Surplus organic solvent and water in the present composition is removed from the substrate by this rotation, but at least some of the gap filling compound remains. Since all in the composition are not removed from inter-pattern regions, pattern collapse is thought to be prevented.

[Step (iii)]

FIG. 1 (f) shows a pattern formed after the removal of the filled composition. The removal of the composition can be carried out by heating, reduced pressure, air-drying, leaving the composition as is, or a combination thereof. These removal methods may be any method so long as they do not impair the pattern shape. Further, temperature conditions and pressure conditions among others can be selected optionally. The removal of the composition can be suitably carried out by heating. In this instance, the heating temperature is not particularly limited, but it is preferably not less than 50° C. and not more than 500° C., more preferably not less than 70° C. and not more than 300° C., and still more preferably not less than 80° C. and not more than 200° C. The heating time is not particularly limited, but it is preferably not less than 30 seconds and not more than 300 seconds, more preferably not less than 30 seconds and not more than 240 seconds, and still more preferably not less than 30 seconds and not more than 180 seconds. Further, when the removal of the composition is carried out by reduced pressure, the pressure generally only has to be not more than 50 kPa, and for example, it is preferably not more than 20 kPa, more preferably not more than 10 k Pa, and still more preferably not more than 7 kPa. The duration of the reduced pressure is not particularly limited, but it is preferably not more than 60 minutes, and more preferably not more than 10 minutes. The conditions of the reduced pressure can be controlled by using a desiccator or an oil pump. In addition, the, removal of the composition by air-drying can be carried out by holding the patterns in airflow. In this instance, airflow can be generated by either positive or negative pressure. Specifically, airflow can be generated by spraying a gas. In this instance, although the gas to be used is not particularly limited, air among others can be used, and inactive gases are preferable. Specifically, nitrogen and argon gasses among others are preferably used. The flow rate of the airflow is not particularly limited, but it is selected so that the composition may be removed adequately. In the removal of the above-described composition, the humidity of atmosphere or of the gas generating airflow is preferably low, and for example, it can be not more than 10%, and it is preferably not more than 5%, more preferably not more than 1%, and particularly preferably not more than 0.1%.

Now, as shown in FIG. 1 (f), the line width of the pattern formed on the substrate is defined as x, and the length thereof in a depth direction is y. The aspect ratio of the pattern is represented by y/x. In particular, the pattern forming method according to the present invention can effectively reduce pattern collapse also for fine patterns having a high aspect ratio. From the viewpoint of the dimension of formed patterns, y is generally not less than 0.05 µm and not more than 6 µm, preferably not less than 0.01 µm and not more than 2 µm, and more preferably not less than 0.3 µm and not more than 1 µm. The aspect ratio is, preferably not less than 5 and not more than 25, and more preferably not less than 15 and not more than 22.

[Post-Processing]

The formed pattern is then, as required, further subjected to post-processings such as processing the substrate and forming circuits, to form elements. These post-processings can be carried out by using any conventionally known method. After the element formation, the substrate is cut into chips, connected to lead frames, and packaged in resin, as required. In the present invention, this packaged chip will be referred to as a device. Suitably, the device is, for example, semiconductor.

The present invention will be described as follows by using Examples. Embodiments of the present invention are not limited to these Examples.

EXAMPLES

Solubility Evaluation: Examples 101 to 119

Compounds listed in Table 1 were mixed to each of PGME, IPA, and water so that the content of the compounds might be 20% by mass, and then stirred. Evaluation criteria were as follows. Evaluation results were as listed in Table 1.

A: transparent solution after stirred

B: dispersed uniformly after stirred, but turbidity was observed.

C: not dissolved after stirred, and deposit was observed.

Hereinafter, 'n.a.' means 'unable to be evaluated.'

TABLE 1

|  |  | gap filling compound | solvent | | |
|---|---|---|---|---|---|
|  |  |  | PGME | IPA | water |
| Examples | 101 | 1,2-butanediol | A | A | A |
|  | 102 | 1,3-butanediol | A | A | A |
|  | 103 | 1,4-butanediol | A | A | A |
|  | 104 | 1,2-pentanediol | A | A | A |
|  | 105 | 1,3-pentanediol | A | A | A |
|  | 106 | 2,4-pentanediol | A | A | A |
|  | 107 | 1,5-pentanediol | A | A | A |
|  | 108 | 1,2-hexanediol | A | A | A |
|  | 109 | 2,5-hexanediol | A | A | A |
|  | 110 | 2,4-dimethyl-2,4-pentanediol | A | A | A |
|  | 111 | 3-methyl-1,5-pentanediol | A | A | A |
|  | 112 | 1,3-cyclopentanediol | A | A | A |
|  | 113 | 1,2-cyclohexanediol | A | A | A |
|  | 114 | 1,3-cyclohexanediol | A | A | A |
|  | 115 | 1,4-cyclohexanediol:1,3-cyclohexanediol = 8:1 | A | A | A |
|  | 116 | 1,2,6-hexanetriol | A | A | A |
|  | 117 | 1,3,5-cyclohexanetriol | A | A | A |
|  | 118 | 1,3-butanediol:trimethylolethane = 1:1 | A | A | A |
|  | 119 | 4-methylcatechol | A | A | A |

Evaluation of Application Property: Examples 201 to 219

Onto a silicon substrate was dropped about 10 cc of a solution prepared from compounds listed in Table 2 below mixed to each of PGME, IPA and water so that the mass ratio of the compounds might be 20% to total mass of the composition, and then applied, with the substrate rotated at 1000 rpm. Then, the surface of the substrate was observed, and the application property of the composition was evaluated. Evaluation criteria were as follows and obtained results were as listed in Table 2.

A: uniform coating was formed

B: coating was formed but contained plaque

C: coating was not formed

TABLE 2

| | | gap filling compound | coatability after dissolution into each solvent | | | |
|---|---|---|---|---|---|---|
| | | | PGME | IPA | IPA:water = 7:3 | water |
| Examples | 201 | 1,2-butanediol | A | A | A | C |
| | 202 | 1,3-butanediol | A | A | A | C |
| | 203 | 1,4-butanediol | A | A | A | C |
| | 204 | 1,2-pentanediol | A | A | A | C |
| | 205 | 1,3-pentanediol | A | A | A | C |
| | 206 | 2,4-pentanediol | A | A | A | C |
| | 207 | 1,5-pentanediol | A | A | A | C |
| | 208 | 1,2-hexanediol | A | A | A | C |
| | 209 | 2,5-hexanediol | A | A | A | C |
| | 210 | 2,4-dimethyl-2,4-pentanediol | A | A | A | C |
| | 211 | 3-methyl-1,5-pentanediol | A | A | A | C |
| | 212 | 1,3-cyclopentanediol | B | B | A | C |
| | 213 | 1,2-cyclohexanediol | B | B | A | C |
| | 214 | 1,3-cyclohexanediol | B | B | A | C |
| | 215 | 1,4-cyclohexanediol:1,3-cyclohexanediol = 8:1 | A | A | A | C |
| | 216 | 1,2,6-hexanetriol | A | B | A | C |
| | 217 | 1,3,5-cyclohexanetriol | A | B | A | C |
| | 218 | 1,3-butanediol:trimethylolethane = 1:1 | A | A | A | C |
| | 219 | 4-methylcatechol | A | A | A | A |

Evaluation of Impact of Mixing Ratio of IPA and Water

Compounds listed in Table 3 were mixed to a solvent having various ratios of IPA and water so that the mass ratio of the compounds might be 20% to the total mass of the compositions, and the solubility and application property of the compositions were evaluated. When the ratio was IPA:water=1:0 or 3:1, a coating was able to be formed, and the film thickness thereof was 1.4 μm. The coating was baked at 110° C. for 60 seconds, and the remaining coating was less than 5 nm in thickness. Evaluation criteria were the same as for the above-described results in Solubility evaluation and Evaluation of application property. The obtained results were as listed in Table 3.

TABLE 3

| gap filling composition | | | | film |
|---|---|---|---|---|
| gap filling compound | solvent | solubility | coatability | thickness |
| 1,3-butanediol | IPA:water = 1:0 | A | A | 1.3 μm |
| | IPA:water = 3:1 | A | A | 1.4 μm |

TABLE 3-continued

| gap filling composition | | | | film |
|---|---|---|---|---|
| gap filling compound | solvent | solubility | coatability | thickness |
| | IPA:water = 1:1 | A | C | n.a. |
| | IPA:water = 1:3 | A | C | n.a. |
| | IPA:water = 0:1 | A | C | n.a. |

Evaluation of Residue: Examples 401A to 419, Reference Example 420

To a silicon substrate was applied a composition prepared from compounds listed in Table 4 dissolved into each of solvents listed in Table 4 below so that the mass ratio of the compounds might be 20% to the total mass of the composition. The film thickness of the composition after application was 1.2 or 1.3 μm, as listed in Table 3. Then the sample was baked at 110° C. for 60 seconds, 130° C. for 60 seconds, and/or 280° C. for 180 seconds, and then the film thickness was measured. The result was described as post-bake thickness of residual film in Table 3. Obtained results were as listed in Table 4.

TABLE 4

| | | gap filling composition | | film thickness (μm) | post-bake thickness of residual film(μm) | | |
|---|---|---|---|---|---|---|---|
| | | gap filling compound | solvent | | 110° C./ 60 s | 130° C./ 60 s | 280° C./ 180 s |
| Examples | 401A | 1,2-butanediol | PGME | 1.2 | 0 | 0 | — |
| | 401B | | IPA | 1.2 | 0 | 0 | — |
| | 401C | | IPA:water = 7:3 | 1.2 | 0 | 0 | — |
| | 402A | 1,3-butanediol | PGME | 1.2 | 0 | 0 | — |
| | 402B | | IPA | 1.2 | 0 | 0 | — |
| | 402C | | IPA:water = 7:3 | 1.2 | 0 | 0 | — |
| | 403A | 1,4-butanediol | PGME | 1.2 | 0 | 0 | — |
| | 403B | | IPA | 1.2 | 0 | 0 | — |
| | 403C | | IPA:water = 7:3 | 1.2 | 0 | 0 | — |
| | 404A | 1,2-pentanediol | PGME | 1.2 | 0 | 0 | — |
| | 404B | | IPA | 1.2 | 0 | 0 | — |

TABLE 4-continued

| | | gap filling composition | | film thickness (µm) | post-bake thickness of residual film(µm) | | |
|---|---|---|---|---|---|---|---|
| | | gap filling compound | solvent | | 110° C./ 60 s | 130° C./ 60 s | 280° C./ 180 s |
| | 404C | | IPA:water = 7:3 | 1.2 | 0 | 0 | — |
| | 405A | 1,3-pentanediol | PGME | 1.3 | 0 | 0 | — |
| | 405B | | IPA | 1.3 | 0 | 0 | — |
| | 405C | | IPA:water = 7:3 | 1.3 | 0 | 0 | — |
| | 406A | 2,4-pentanediol | PGME | 1.2 | 0 | 0 | — |
| | 406B | | IPA | 1.2 | 0 | 0 | — |
| | 406C | | IPA:water = 7:3 | 1.2 | 0 | 0 | — |
| | 407A | 1,5-pentanediol | PGME | 1.2 | 0 | 0 | — |
| | 407B | | IPA | 1.2 | 0 | 0 | — |
| | 407C | | IPA:water = 7:3 | 1.2 | 0 | 0 | — |
| | 408A | 1,2-hexanediol | PGME | 1.2 | 0 | 0 | — |
| | 408B | | IPA | 1.2 | 0 | 0 | — |
| | 408C | | IPA:water = 7:3 | 1.2 | 0 | 0 | — |
| | 409A | 2,5-hexanediol | PGME | 1.2 | 0 | 0 | — |
| | 409B | | IPA | 1.2 | 0 | 0 | — |
| | 409C | | IPA:water = 7:3 | 1.2 | 0 | 0 | — |
| | 410 | 2,4-dimethyl-2,4-pentanediol | PGME | 1.2 | 0 | 0 | — |
| | 411 | 3-methyl-1,5-pentanediol | PGME | 1.2 | 0 | 0 | — |
| | 412 | 1,3-cyclopentanediol | PGME | 1.2 | 0 | 0 | — |
| | 413 | 1,2-cyclohexanediol | PGME | 1.2 | 0 | 0 | — |
| | 414 | 1,3-cyclohexanediol | PGME | 1.3 | 0 | 0 | — |
| | 415 | 1,4-cyclohexanediol:1,3-cyclohexanediol = 8:1 | PGME | 1.2 | 0 | 0 | — |
| | 416 | 1,2,6-hexanetriol | PGME | 1.2 | 0.3 | 0 | — |
| | 417 | 1,3,5-cyclohexanetriol | PGME | 1.2 | 0.5 | 0 | — |
| | 418 | 1,3-butanediol:trimethylolethane = 1:1 | PGME | 1.2 | 0.5 | 0 | — |
| | 419 | 4-methylcatechol | PGME | 1.2 | 0.5 | 0 | — |
| Reference example | 420 | polyethylene glycol (20%) | water | 1.3 | 1.3 | 1.3 | 0 |

Evaluation of Pattern Collapse Rate, Examples 501A to 519, Reference Example 520, Comparative Examples 501 to 502

To an 8 inch silicon substrate was applied U98 Ctg 85 (from Merck Performance Materials G.K., hereinafter abbreviated as Merck) by a spin coater (MK-VIII from Tokyo Electron Limited), pre-baked at 250° C. for 180 seconds on a hot plate, to form a carbon coating layer of 200 nm in film thickness. AZSH24H (from Merck) was applied to the sample and pre-baked at 120° C. for 60 seconds on a hot plate, to form a silicon-containing anti-reflective coating layer of 35 nm in film thickness. AZ AX2110P (from Merck) which is an ArF resist was further applied to the sample and pre-baked at 110° C. for 60 seconds on the hot plate, to form a resist layer of 120 nm in film thickness. The obtained substrate was exposed by an ArF exposure apparatus (NSR-S306C (trade name) from Nikon Corporation), heated under a condition of 110° C./60 seconds, developed by using a 2.38% TMAH aqueous solution, and then rinsed in pure water, to fabricate a substrate including a resist line and space pattern of 110 nm (1:1).

The obtained resist pattern was used as a mask to dry-etch the silicon-containing anti-reflective coating layer by $CF_4$ plasma for 6 seconds (25° C., 5 Pa, 200 W), to yield a silicon-containing anti-reflective coating layer pattern. Then, the silicon-containing anti-reflective coating layer pattern was used as a mask to dry-etch the applied carbon coating layer for 40 seconds (25° C., 0.67 Pa, 100 W) by oxygen and nitrogen (3:7) plasma, to yield a applied carbon coating layer pattern. Then, the applied carbon coating layer pattern was used as a mask to dry-etch the silicon substrate by $CF_4$ plasma for 6 seconds (25° C., 5 Pa, 200 W), to yield a silicon substrate including gaps formed thereon which had an aspect ratio of about 6. Then, the inter-gap portions of the substrate were cleaned by using an aqueous solution containing 3% HF and 2% HCl, and then, rinsed by water and subsequently IPA. In this instance, IPA remained between the gaps.

Then, IPA between the gaps was replaced with a gap filling composition prepared from gap filling compounds listed in Table 5 dissolved into each of solvents listed in Table 5 so that the mass ratio of the compounds might be 20% to the total mass of the composition. Specifically, IPA was replaced with the gap filling composition which was dropped to be filled, with the substrate rotated at 10 rpm, and then this substrate was rotated at 1,000 rpm for 20 seconds. Next, the substrate was heated at 250° C. for 180 seconds, and then the number of collapsed patterns was measured. Comparative examples 501 and 502, as in conventional rinse treatment, were not heated and were dried by spin dry. A pattern collapse rate was defined as the number of collapsed patterns divided by that in the case of water in Comparative example 502.

TABLE 5

| | | gap filling composition | | pattern collapse rate (%) |
|---|---|---|---|---|
| | | gap filling compound | solvent | |
| Examples | 501A | 1,2-butanediol | PGME | 5 |
| | 501B | | IPA | 7 |
| | 501C | | IPA:water = 7:3 | 4 |
| | 502A | 1,3-butanediol | PGME | 7 |
| | 502B | | IPA | 5 |
| | 502C | | IPA:water = 7:3 | 5 |
| | 503A | 1,4-butanediol | PGME | 5 |
| | 503B | | IPA | 6 |
| | 503C | | IPA:water = 7:3 | 3 |
| | 504A | 1,2-pentanediol | PGME | 6 |
| | 504B | | IPA | 4 |
| | 504C | | IPA:water = 7:3 | 6 |
| | 505A | 1,3-pentanediol | PGME | 4 |
| | 505B | | IPA | 5 |
| | 505C | | IPA:water = 7:3 | 4 |
| | 506A | 2,4-pentanediol | PGME | 5 |
| | 506B | | IPA | 3 |
| | 506C | | IPA:water = 7:3 | 5 |
| | 507A | 1,5-pentanediol | PGME | 3 |
| | 507B | | IPA | 6 |
| | 507C | | IPA:water = 7:3 | 7 |
| | 508A | 1,2-hexanediol | PGME | 6 |
| | 508B | | IPA | 4 |
| | 508C | | IPA:water = 7:3 | 5 |
| | 509A | 2,5-hexanediol | PGME | 4 |
| | 509B | | IPA | 5 |
| | 509C | | IPA:water = 7:3 | 4 |
| | 510 | 2,4-dimethyl-2,4-pentanediol | PGME | 3 |
| | 511 | 3-methyl-1,5-pentanediol | PGME | 2 |
| | 512 | 1,3-cyclopentanediol | PGME | 5 |
| | 513 | 1,2-cyclohexanediol | PGME | 3 |
| | 514 | 1,3-cyclohexanediol | PGME | 4 |
| | 515 | 1,4-cyclohexanediol:1,3-cyclohexanediol = 8:1 | PGME | 3 |
| | 516 | 1,2,6-hexanetriol | PGME | 4 |
| | 517 | 1,3,5-cyclohexanetriol | PGME | 5 |
| | 518 | 1,3-butanediol:trimethylolethane = 1:1 | PGME | 5 |
| | 519 | 4-methylcatechol | PGME | 5 |
| Reference example | 521 | polyethylene glycol(20%) | water | 5 |
| Comparative examples | 501 | IPA | | 90 |
| | 502 | water | | 100 |

Removal of Composition by Reduced Pressure: Examples 603 to 617 and Comparative Example 602

A silicon substrate including gaps formed thereon which had an aspect ratio of 6 was obtained by the same method as in Example 501. Then, cleaning and rinsing were carried out by the same method as in Example 501, to yield a silicon substrate containing IPA remaining between the gaps.

IPA remaining between the gaps was replaced with each of gap filling compositions listed in Table 6. Specifically, IPA was replaced with the gap filling composition dropped to be filled, with the substrate rotated at 1,500 rpm, and then this substrate was rotated at 1,000 rpm for 20 seconds. Then, the substrate was put in a desiccator, and the gap filling composition was removed under reduced pressure by using an oil pump. The pressure and the time for the reduced pressure were as listed in Table 6. Obtained results were as in Table 6.

TABLE 6

|  |  | gap filling composition gap filling compound | concentration | solvent | reduced pressure pressure/time | pattern collapse rate (%) |
|---|---|---|---|---|---|---|
| Examples | 603 | 1,4-butanediol | 22% | IPA | 6.6 kPa/300 s | 0 |
|  | 607 | 1,5-pentanediol | 25% | PGME | 5.3 kPa/301 s | 0 |
|  | 609 | 2,5-hexanediol | 20% | IPA | 4.7 kPa/302 s | 0 |
|  | 613 | 1,2-cyclohexanediol | 22% | PGMEA | 1.6 kPa/303 s | 0 |
|  | 614 | 1,3-cyclohexanediol | 24% | IPA | 0.8 kPa/304 s | 0 |
|  | 616 | 1,2,6-hexanetriol | 22% | PGME | 3.5 kPa/306 s | 0 |
|  | 617 | 1,3,5-cyclohexanetriol | 21% | IPA | 2.8 kPa/307 s | 0 |
| Comparative example | 602 | water |  |  | 10 kPa/300 s | 100 |

Removal of Composition by Air-Dry: Examples 703 to 717 and Comparative Example 702

A silicon substrate including gaps formed thereon which had an aspect ratio of 6 was obtained by the same method as in Example 501. Then, by using the same method as in Example 501, cleaning and rinsing were carried out and a silicon substrate containing IPA remaining between the gaps was obtained.

Then, IPA remaining between the gaps was replaced with each of gap filling compositions listed in Table 7. Specifically, IPA was replaced with each of the gap filling compositions dropped to be filled, with the substrate rotated at 1,500 rpm, and then this substrate was rotated at 1,000 rpm for 20 seconds. Then, nitrogen gas was sprayed on the substrate surface for 10 minutes by a gas gun, with the substrate rotated at 500 rpm, to remove the gap filling composition. Obtained results were as in Table 7.

TABLE 7

|  |  | gap filling composition | | | pattern collapse rate (%) |
|---|---|---|---|---|---|
|  |  | gap filling compound | concentration | solvent |  |
| Examples | 703 | 1,4-butanediol | 22% | IPA | 1 |
|  | 707 | 1,5-pentanediol | 25% | PGME | 1 |
|  | 709 | 2,5-hexanediol | 20% | IPA | 0.4 |
|  | 713 | 1,2-cyclohexanediol | 22% | PGMEA | 0 |
|  | 714 | 1,3-cyclohexanediol | 24% | IPA | 0 |
|  | 716 | 1,2,6-hexanetriol | 22% | PGME | 1 |
|  | 717 | 1,3,5-cyclohexanetriol | 21% | IPA | 0.5 |
| Comparative example | 702 | water |  |  | 100 |

REFERENCE SIGNS LIST 1. substrate
2. applied carbon film layer
3. silicon-containing antireflection film layer
4. resist pattern
5. gap
6. liquid
7. composition according to invention
8. pattern
9. pattern

The invention claimed is:

1. A method of forming a pattern, comprising:
   (i) the step of etching a substrate to form a gap;
   (ii) the step of filling a gap filling composition comprising a low molecular weight compound having 2 to 25 carbon atoms into the substrate surface comprising a gap formed thereon; and
   (iii) the step of removing the composition by heating, reduced pressure, air-drying, or a combination thereof and
   wherein at the end of the step (i), the substrate surface is contacted to a liquid and then the gap is filled with the liquid,
   in the step (ii) the liquid is replaced by the gap filling composition;
   wherein the low molecular weight compound having 2 to 25 carbon atoms is a gap filling compound represented by following general formula (Ia) or formula (Ib)

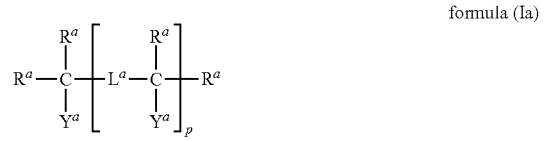

formula (Ia)

wherein each $R^a$ independently represents hydrogen, alkyl having 1 to 5 carbon atoms, or aryl having 6 to 12 carbon atoms,
each $L^a$ independently represents, alkylene having 1 to 10 carbon atoms, haloalkylene having 1 to 10 carbon atoms, heteroalkylene having 1 to 10 carbon atoms comprising oxy, imino, or sulfide on a terminal or between carbons thereof, oxy, imino, sulfide, or a single bond,
each $Y^a$ independently represents —OH, —COOH, or —NR$^1{}_2$,
each $R^1$ independently represents hydrogen or alkyl having 1 to 5 carbon atoms, and
p represents an integer of 1 to 8, or

formula (Ib)

wherein each $R^b$ independently represents alkyl having 1 to 5 carbon atoms, or aryl having 6 to 12 carbon atoms,
$Z^b$ represents cycloalkyl having 3 to 13 ring members, heterocycloalkyl having 3 to 13 ring members comprising O, N, or S, or aryl having 6 to 20 carbon atoms,
each $Y^b$ independently represents —OH, —COOH, or —NR$^2{}_2$,
each $R^2$ independently represents hydrogen or alkyl having 1 to 5 carbon atoms, and
q represents an integer of 2 to 5, and
r represents a maximum number of substituents of the cycloalkyl, the heterocycloalkyl, or the aryl in Zb-q;

the gap filling composition comprises: the gap filling compound; an organic solvent; and water, and the mass ratios of the gap filling compound, the organic solvent, and water to the total mass of the gap filling composition are not less than 1% and not more than 100%, not less than 5% and not more than 99%, not less than 0% and not more than 30%, respectively.

2. The method according to claim 1, wherein the mass ratios of the gap filling compound and the organic solvent to the total mass of the gap filling composition are not less than 2% and not more than 40%, and not less than 20% and not more than 98%, respectively.

3. The method according to claim 1, wherein the composition further comprises a surfactant.

4. The method according to claim 1, wherein the organic solvent is selected from the group consisting of propylene glycol monomethyl ether acetate, propylene glycol monomethyl ether, isopropyl alcohol, n-butyl alcohol, methyl isobutyl ketone, tetrahydrofuran, dibutyl ether, ethyl lactate, methyl acetate, ethyl acetate, butyl acetate, 2-heptanone, γ-butyrolactone, and any combination of any thereof.

5. The method according to claim 1, wherein a vapor pressure of the gap filling compound at 150° C. and 1 atm is not less than 100 Pa and not more than 40,000 Pa.

6. The method according to claim 1, wherein the low molecular weight compound is a compound represented by the following general formula (Ia)

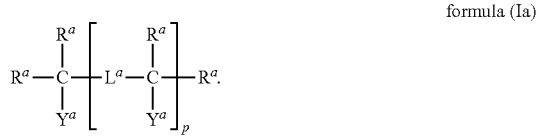

formula (Ia)

7. The method according to claim 1, comprising forming, by dry etching and/or wet etching, a mask for etching the substrate.

8. The method according to claim 1, wherein the step (iii) is carried out by heating at not less than 50° C. and not more than 500° C. for not less than 30 seconds and not more than 300 seconds.

9. The method according to claim 1, wherein in the step (i) an etching amount in a depth direction of the substrate is not less than 0.05 μm and not more than 6.00 μm.

10. The method according to claim 1, wherein an aspect ratio of the pattern is not less than 5 and not more than 25.

11. The method according to claim 1, wherein the gap filling compound of the formula (Ia) or formula (Ib) has a molecular weight up to 250.

12. The method according to claim 1, wherein the gap filling compound of the formula (Ia) or formula (Ib) has a molecular weight up to 150.

13. The method according to claim 1, wherein the gap filling compound of the formula (Ia) or formula (Ib) has 2 to 10 carbon atoms.

14. The method according to claim 1, wherein the gap filling compound of the formula (Ia) or formula (Ib) has 2 to 10 carbon atoms.

15. The method as claimed in claim 1, wherein the mass ratio of water to the total mass of the gap filling composition is less than that of the organic solvent.

16. The method as claimed in claim 1, wherein the gap filling compound consists essentially of the compound of the general formula (Ia) or formula (Ib).

17. The method according to claim 16, wherein the gap filling compound of the formula (Ia) or formula (Ib) has a molecular weight up to 250.

18. The method as claimed in claim 1, wherein the gap filling compound consists of the compound of the general formula (Ia) or formula (Ib).

19. The method as claimed in claim 1, wherein the gap filling composition consists essentially of the gap filling compound; an organic solvent; and water.

* * * * *